United States Patent
Reinke et al.

(10) Patent No.: US 10,131,535 B2
(45) Date of Patent: Nov. 20, 2018

(54) MONOLITHIC FABRICATION OF THERMALLY ISOLATED MICROELECTROMECHANICAL SYSTEM (MEMS) DEVICES

(71) Applicant: Honeywell International Inc., Morristown, NJ (US)

(72) Inventors: John R. Reinke, Plymouth, MN (US); Grant H. Lodden, Minnetrista, MN (US)

(73) Assignee: Honeywell International Inc., Morris Plains, NJ (US)

( * ) Notice: Subject to any disclaimer, the term of this patent is extended or adjusted under 35 U.S.C. 154(b) by 461 days.

(21) Appl. No.: 14/806,201

(22) Filed: Jul. 22, 2015

(65) Prior Publication Data
US 2016/0340174 A1 Nov. 24, 2016

Related U.S. Application Data

(60) Provisional application No. 62/165,286, filed on May 22, 2015.

(51) Int. Cl.
*B81B 7/00* (2006.01)
*B81C 1/00* (2006.01)
(Continued)

(52) U.S. Cl.
CPC .......... *B81B 7/0019* (2013.01); *B81B 3/0081* (2013.01); *B81B 7/0087* (2013.01);
(Continued)

(58) Field of Classification Search
CPC ............ H02N 1/00; B81B 7/001; H01L 29/84
(Continued)

(56) References Cited

U.S. PATENT DOCUMENTS 5,133,215 A    7/1992  Lane, III et al.
7,569,410 B2   8/2009  Hartzell et al.
(Continued)

FOREIGN PATENT DOCUMENTS

EP    2455329     5/2012
EP    2700614     2/2014
KR    100701152   3/2007

OTHER PUBLICATIONS

European Patent Office, "Extended European Search Report from EP Application No. 15178744.7 dated Jan. 8, 2016", Jan. 8, 2016, pp. 1-6, Published in: EP.

(Continued)

*Primary Examiner* — Burton Mullins
(74) *Attorney, Agent, or Firm* — Fogg & Powers LLC

(57) ABSTRACT

A method for fabricating a thermally isolated microelectromechanical system (MEMS) structure is provided. The method includes processing a first wafer of a first material with a glass wafer to form a composite substrate including at least one sacrificial structure of the first material and glass; forming a MEMS device in a second material; forming at least one temperature sensing element on at least one of: the composite substrate; and the MEMS device; and etching away the at least one sacrificial structure of the first material in the composite substrate to form at least one thermally isolating glass flexure. The MEMS device is thermally isolated on a thermal isolation stage by the at least one thermally isolating glass flexure. The at least one temperature sensing element in on a respective at least one of: the thermal isolation stage; and the MEMS device.

16 Claims, 11 Drawing Sheets

(51) Int. Cl.
*H02N 1/00* (2006.01)
*B81B 3/00* (2006.01)

(52) U.S. Cl.
CPC ............. *B81C 1/0069* (2013.01); *H02N 1/00* (2013.01); *B81B 2201/025* (2013.01); *B81B 2201/0228* (2013.01)

(58) Field of Classification Search
USPC ........... 310/300, 308, 321, 330, 323.21, 332
See application file for complete search history.

(56) References Cited

U.S. PATENT DOCUMENTS

| | | | |
|---|---|---|---|
| 8,227,285 | B1 | 7/2012 | Yang |
| 8,698,292 | B2 | 4/2014 | Najafi et al. |
| 8,735,199 | B2 | 5/2014 | Supino et al. |
| 9,018,724 | B2 | 4/2015 | Ting et al. |
| 2004/0248344 | A1 | 12/2004 | Partridge et al. |
| 2005/0217373 | A1* | 10/2005 | Ishikawa ............... B81B 3/0051 73/493 |
| 2007/0290282 | A1* | 12/2007 | Belov ..................... H01F 7/066 257/421 |
| 2009/0071260 | A1 | 3/2009 | Speldrich |
| 2009/0085191 | A1 | 4/2009 | Najafi et al. |
| 2010/0290199 | A1 | 11/2010 | Schmid et al. |
| 2010/0312468 | A1 | 12/2010 | Withanawasam |
| 2012/0032286 | A1* | 2/2012 | Trusov ................... G01C 21/16 257/417 |
| 2012/0130671 | A1* | 5/2012 | Horning ................ B81B 7/0016 702/141 |
| 2013/0050227 | A1 | 2/2013 | Petersen et al. |
| 2014/0092935 | A1* | 4/2014 | Lin ........................ G01N 25/48 374/10 |
| 2014/0191419 | A1* | 7/2014 | Mallik ................. H01L 25/0652 257/777 |
| 2015/0137341 | A1* | 5/2015 | Liu ...................... H01L 23/5386 257/692 |
| 2016/0039664 | A1* | 2/2016 | Lodden ............... B81C 1/00269 257/414 |
| 2016/0123817 | A1* | 5/2016 | Bennett ................... G01K 7/16 345/156 |

OTHER PUBLICATIONS

U.S. Patent and Trademark Office, "Final Office Action", "U.S. Appl. No. 14/453,155", dated Apr. 22, 2016, pp. 1-16.
U.S. Patent and Trademark Office, "Office Action", "U.S. Appl. No. 14/453,155", dated Oct. 9, 2015, pp. 1-30.
Qin et al., "Highly-Reliable Silicon and Glass Interposers-To-Printed Wiring Board SMT Interconnections: Modeling, Design, Fabrication and Reliability", "Electronics Components and Testing (ECTC)", 2012, pp. 1738-1745, No. 62nd ECTC, Publisher: IEEE, Published in: US.
U.S. Patent and Trademark Office, "Office Action", "U.S. Appl. No. 14/453,155", dated Nov. 4, 2016, pp. 1-14, Published in: US.
U.S. Patent and Trademark Office, "Final Office Action", "U.S. Appl. No. 14/453,155", dated Apr. 19, 2017, pp. 1-15.
U.S. Patent and Trademark Office, "Advisory Action", "U.S. Appl. No. 14/453,155", dated Jul. 28, 2017, Published in: US.
Lodden et al., "Monolithic Integration of Stress Isolation Feautures in a Microelectromechanical System (MEMS) Structure", "U.S. Appl. No. 14/453,155, filed Aug. 16, 2014", Aug. 16, 2014, pp. 1-24, Published in: US.
Cai et al., "A Novel Approach for Achieving Bulk Silicon MEMS on CMOS Substrate by Au—Au Bonding", 2011, pp. 1-4, Publisher: IEEE, Published in: US.
Lei et al., "A Parylene-Filled-Trench Technique for Thermal Isolation in Silicon-Based Microdevices", "Journal of Micromechanics and Microengineering", Feb. 18, 2009, pp. 1-7, Publisher: IOP Publishing Ltd, Published in: GB.
Li et al., "An Ultra-Low Power Ovenized CMOS-MEMS Resonator Monolithically Integrated With Interface Circuits", Jan. 20-Jan. 24, 2013, pp. 753-756, Publisher: National Tsing Hua University, Published in: TW.
European Patent Office, "Extended European Search Report from EP Application No. 16168459.2 dated Sep. 15, 2016", "from Foreign Counterpart of U.S. Appl. No. 14/806,201", Sep. 15, 2016, pp. 1-7, Published in: EP.

* cited by examiner

MONOLITHIC FABRICATION OF THERMALLY ISOLATED MICROELECTROMECHANICAL SYSTEM (MEMS) DEVICES

CROSS-REFERENCE TO RELATED APPLICATIONS

This application claims benefit of the U.S. Provisional Patent Application Ser. No. 62/165,286, entitled MONOLITHIC FABRICATION OF THERMALLY ISOLATED MEMS DEVICES, filed on May 22, 2015, which is hereby incorporated by reference.

BACKGROUND

Some microelectromechanical system (MEMS) devices are required to operate over wide temperature ranges, but the performance of these devices is often adversely affected by temperature changes. For example, the bias and scale factor of MEMS inertial sensors varies significantly from −45° C. to 85° C. To minimize these effects, sensor output data is often temperature-compensated based on a one-time factory calibration. Calibration mitigates errors but does not eliminate them entirely. One method often used to further improve a MEMS device is to keep the device heated at a temperature just above the maximum specified operating temperature. Stabilizing the MEMS device temperature theoretically eliminates the adverse effects of temperature change.

Temperature stabilization often requires unacceptable levels of power consumption. Active temperature control can be performed with limited power consumption if sufficient thermal isolation is achieved. Sufficient thermal isolation in prior art systems requires increasing the complexity (and thus the cost) because of the constraints imposed on device geometry and materials.

The solutions provided by the prior art include non-monolithic systems in which a thermal isolation stage is fabricated separately from the MEMS die. After fabrication of the thermal isolation stage, a MEMS die is attached to the thermal isolation stage by soldering, thermo-sonic bonding, bump bonding, etc. Cost and complexity is increased by the need for both: 1) a process to fabricate the separate thermal isolation stage; and 2) a process to attach the MEMS die to the thermal isolation stage. The additional processing to attach the die to the thermal isolation stage can be detrimental to long term stability of the MEMS die and lead to degraded performance due to mechanical drift of the attachment points.

SUMMARY

The present application relates to method for fabricating a thermally isolated microelectromechanical system (MEMS) structure. The method includes processing a first wafer of a first material with a glass wafer to form a composite substrate including at least one sacrificial structure of the first material and glass; forming a MEMS device in a second material; forming at least one temperature sensing element on at least one of: the composite substrate; and the MEMS device; and etching away the at least one sacrificial structure of the first material in the composite substrate to form at least one thermally isolating glass flexure. The MEMS device is thermally isolated on a thermal isolation stage by the at least one thermally isolating glass flexure. The at least one temperature sensing element in on a respective at least one of: the thermal isolation stage; and the MEMS device.

DRAWINGS

FIGS. 1-7 are cross-sectional side views of various stages of production of a composite substrate including at least one embedded sacrificial structure embedded in glass according to embodiments of the present application;

FIGS. 8A, 8B, and 9 are cross-sectional side views for various stages of production of embodiments of processing a second wafer to form a MEMS device on a substrate according to embodiments of the present application;

Figure 1:
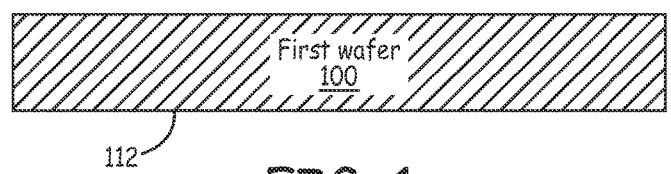

In accordance with common practice, the various described features are not drawn to scale but are drawn to emphasize specific features relevant to the exemplary embodiments.

DETAILED DESCRIPTION

Embodiments of the microelectromechanical system (MEMS) structure or device architecture described herein integrate a MEMS device in a thermal isolation structure to thermally isolate the MEMS device from an external environment. The thermal isolation structure is formed from a material that is sufficiently thermally non-conductive to isolate the MEMS device from an external environment. For purposes of this specification, the term "thermal isolation structure", on which the MEMS device is integrated, is a structure, which has a low enough thermal conductivity so that heat transfer (either to or from the MEMS device) occurs at a relatively low rate. In one implementation of this embodiment, the thermal isolation structure includes a thermal isolation stage and at least one thermally isolating flexure.

The MEMS structures described herein are a low cost MEMS structures that maintain a MEMS device at a desired temperature with relatively low power requirements. The thermally isolated stage is maintained at a selected temperature by actively heating the thermally isolated stage. The power required to maintain the desired temperature of the thermally isolated stage is much lower than in prior art systems, since the thermal isolation stage supporting the MEMS device is thermally isolated by the at least one thermally isolating flexure from the external environment.

The thermally isolating flexure is a beam that connects a thermally isolated stage containing the MEMS device to a fixed frame that is anchored to a package. For purposes of this specification, the term "thermally isolating flexure" is one or more flexure, which has a low enough thermal conductivity so that heat transfer from the thermal isolation stage to an outer frame occurs at a relatively low rate due, at least in part, to the small cross sectional area of the flexure. In one implementation of this embodiment, the thermally isolating structure is formed from glass.

When the thermally isolating structure is formed from glass, the MEMS device integrated with the glass thermal isolation stage is thermally isolated by the at least one thermally isolating glass flexure from the external environment. The terms "thermally isolating glass flexure", "thermally isolating flexure", and "glass flexure" are used interchangeably herein.

In another implementation of this embodiment, the thermally isolating structure is formed from a material, other than glass, which has an appropriate melting point to permit fabrication of the MEMS structure, and which has an appropriate thermal conductivity to thermally isolate the integrated MEMS device on the thermally isolated stage. The appropriate melting point is less than the melting point of the sacrificial material in a composite substrate, which is described below. The appropriate thermal conductivity is less than or on the order of magnitude of the thermal conductivity of glass (i.e., at or less than an order of magnitude of 1 W/m-K).

Some embodiments of the thermally isolated MEMS structures described herein are fabricated with embedded sacrificial material in a composite substrate that includes at least one sacrificial structure and glass. Other embodiments of the thermally isolated MEMS structures described herein are fabricated with embedded sacrificial material in a composite substrate that includes at least one sacrificial structure and a material that has an appropriate melting point and an appropriate thermal conductivity to permit fabrication of the MEMS structure.

As used herein, the term "sacrificial structure" refers to a feature formed in a layer of material that is removed prior to completion of the process of forming the MEMS structure. In essence, the sacrificial structure acts as a mold to define the structure (shape, size, and location) of the thermal isolation feature in the glass layer of the MEMS structure.

The use of sacrificial structures in a glass layer enables the formation of integrated or embedded thermal isolation features in the MEMS architecture. Traditional methods of patterning glass include wet chemical etch processes and deep reactive ion etching. These methods are often incompatible with various materials in the MEMS device architecture, and are thus undesirable as a means to fabricate thermal isolation features in a glass layer of a MEMS device.

Advantageously, with the sacrificial-material process described herein, the thermal isolation features are defined prior to patterning the glass with recesses and prior to metallization for the MEMS device. To accomplish this, the sacrificial structures are formed with a material having a melting or softening temperature above that of glass. Thus, an array of materials is available for use as sacrificial structures. In one embodiment, a semiconductor material (such as intrinsic silicon) is chosen as the sacrificial material. In addition to having a high melting or softening temperature, silicon is easy to micro-machine via deep reactive ion etching enabling the formation of the high aspect ratio features that are useful for forming the sacrificial features.

The sacrificial material is engineered to be compatible with subsequent MEMS process steps. Following the fabrication of the MEMS device, the embedded sacrificial structures can be removed with a suitable etchant thereby leaving the embedded thermal isolation features in the glass layer. Advantageously, the technique is applicable to any MEMS structure containing a glass layer in its architecture.

The embodiments described below provide an inexpensive method for monolithically fabricating MEMS devices that are directly integrated on glass thermal isolation stages and are anchored by the glass flexure(s) to thermally isolate the MEMS devices. A MEMS device that is temperature sensitive can be easily fabricated in a monolithic thermally isolated package using the technology described herein. Since the MEMS structures described herein are not as complex as prior art MEM structures in thermally isolating packages, the MEMS structures described herein are relatively inexpensive to fabricate and can be used in a large range of temperatures without requiring a large amount of power to hold the MEMS device at an optimal operating temperature.

The fabrication processes described herein use an existing fabrication process that enables sacrificial structures to be embedded in glass. These sacrificial structures are later removed to make cuts (voids) in the glass. The cuts in the glass are used to form at least one glass flexure, a fixed glass frame, and a thermally isolated stage that holds the MEMS device. Since glass has a low thermal conductivity, the glass flexures have high thermal resistance, which minimizes power consumption during heating of the attached stage. The thermal isolation stage, which is attached to at least one the glass flexure, is monolithically integrated with the MEMS device. Thus, this monolithically fabricated system is less complex and less expensive to fabricate than the prior art systems.

In one implementation of this embodiment, the glass thermal isolation stage is anchored to a fixed frame by one or more glass flexures to enable low-power active temperature control of MEMS devices. Metal lines (e.g., trace lines) that have a negligible thermal conductive cross section can be deposited on the glass flexure(s) to electrically connect external circuits to the MEMS device and any other temperature control or temperature reading (i.e., temperature sensing) circuits on the MEMS device or on the thermally isolated stage holding the MEMS device. In one implementation of this embodiment, resistors formed on the glass stage are used for heating and/or temperature read-out (sensing). In this manner, the temperature of the glass stage is controlled to improve the accuracy and the stability of the MEMS device.

The MEMS device can be formed on a composite substrate or on a second wafer that is bonded to the composite substrate. The processing steps described below with reference to FIGS. 1-14 provide two optional possible fabrication flows to build at least one MEMS device on a respective at least one glass thermal isolation stage. In one implementation of this embodiment, the MEMS device is one or more silicon MEMS inertial sensor. The MEMS devices may include, but are not limited to, proof masses, interdigitated comb fingers, flexures, and other electrodes. The processing steps to fabricate embodiments of the MEMS structure are described with reference to a MEMS device on a thermal isolation stage. It is understood that the processing steps to fabricate embodiments of the MEMS structure are applicable to the fabricating a plurality of MEMS structures that include a plurality of MEMS devices on a respective plurality of glass thermal isolation stages.

FIGS. 1-7 are cross-sectional side views of various stages of production of a composite substrate including at least one embedded sacrificial structure embedded in glass according to embodiments of the present application. A first wafer 100 of a first material is provided (FIG. 1). The first wafer 100 is a wafer fabricated in any material that holds its shape when processed at a temperature that causes glass to soften. In one implementation of this embodiment, the first material is a semiconductor material. In another implementation of this embodiment, the first material is silicon. In yet another implementation of this embodiment, the first wafer 100 is a P-type silicon wafer 100. This latter embodiment is described below with reference to FIGS. 1-5 and 6B-13.

Figure 2:
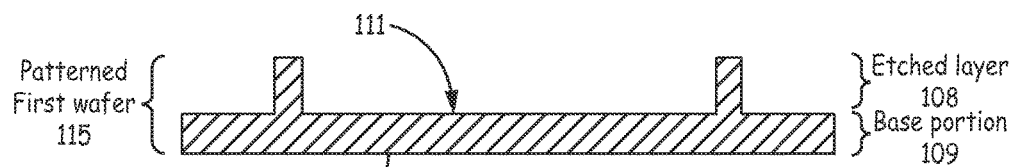

A layer 108 of the first material is etched to form at least one sacrificial structure 110 (FIG. 2). The sacrificial structures 110 are supported on the base portion 109 of the first wafer 100 that remains after the patterning and etching is completed. The at least one sacrificial structure 110 defines a mold for the at least one thermally isolating glass flexure and the thermal isolation stage. In one implementation of this embodiment, a silicon wafer 100 is patterned and etched using deep reactive ion etching (DRIE) to form sacrificial silicon structures 110, which are also referred to herein as "sacrificial structures 110". Other techniques can be used to form the sacrificial structures 110.

The sacrificial structures 110 are patterned in accordance with the desired design of the MEMS device, the thermal isolation stage, and the glass flexure. After the sacrificial silicon structures 110 are formed, the etched silicon wafer 100 shown in FIG. 2 is referred to as a "patterned first wafer 115" or a "patterned silicon wafer 115".

Figure 3:
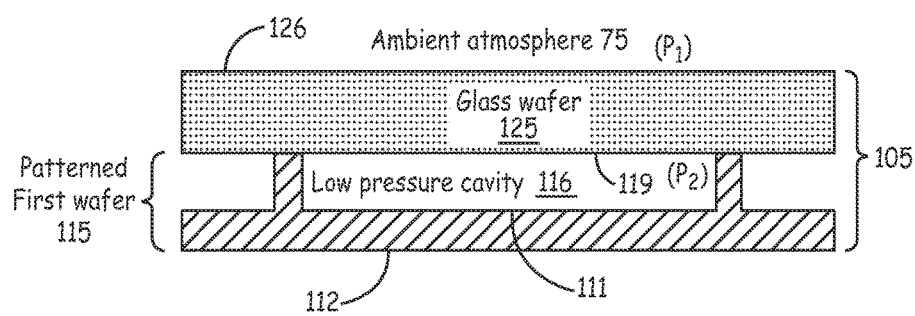

As shown in FIG. 3, a glass wafer 125 is positioned on and bonded to (e.g., anodically bonded to) the patterned first wafer 115 in an atmosphere (i.e., pressure $P_2$) that is less than an external ambient atmosphere 75 (i.e., pressure $P_1$). The glass wafer 125 bonded to the patterned first wafer 115 is referred to herein as a wafer stack 105. In one implementation of this embodiment, the patterned first wafer 115 is a patterned silicon wafer 115 and the glass wafer 125 bonded to the patterned silicon wafer 115 is referred to herein as a glass-silicon wafer stack 105. The following exemplary processing steps are described with reference to the first wafer 100 being a silicon wafer 100.

The glass wafer 125 is bonded to the patterned first wafer 115 in an atmosphere at a pressure $P_2$ that is less than the pressure $P_1$ ($P_1 > P_2$) of an external ambient atmosphere 75, the cavities 116 enclosed by the surface 111, a surface 119 of the glass wafer 125, and the sacrificial structures 110 (e.g., sacrificial first-material structures 110) are at lower pressures $P_2$ relative to the pressure $P_1$ of the ambient atmosphere 75. The glass wafer 125 is also referred to herein as a solid-glass wafer 125 since, in order to ensure a low pressure cavity 116 is formed during a bonding process, the glass wafer 125 is free of any holes or openings that extend through two surfaces opposing surfaces 119 and 126 of the glass wafer 125.

Figure 4:
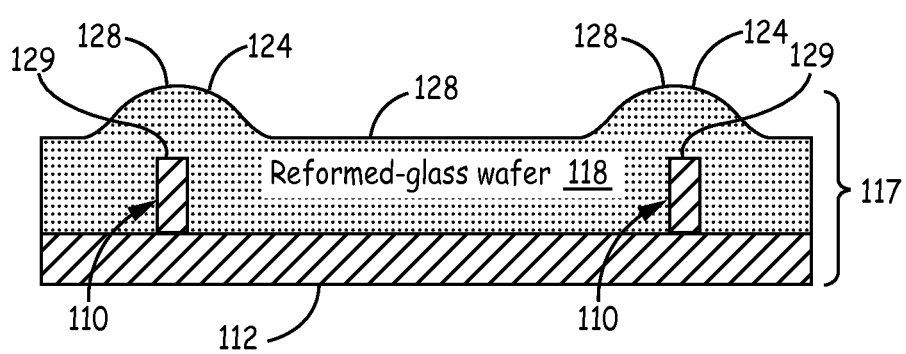

In an ambient atmosphere 75, which is typically at or about atmospheric pressure, the glass-silicon wafer stack 105 is heated to or beyond the softening temperature of the glass. The pressure difference $\Delta P = P_1 - P_2$ between the pressure $P_1$ of the ambient atmosphere 75. The lower pressure $P_2$ of the atmosphere in the cavity 116 causes the softened glass to be pulled into the cavity 116 as shown in FIG. 4. This process forms a modified-glass wafer 117 (FIG. 4) from the wafer stack 105 (FIG. 3). The solid-glass wafer 125 (FIG. 3) is reformed by the melting/softening as a reformed-glass wafer 118 with bumps 124 on the surface 128 in the regions that overlay the sacrificial silicon structures 110. The modified-glass wafer 117 includes the base portion 109 of the patterned silicon wafer 115, the sacrificial silicon structures 110 and the reformed-glass wafer 118 encasing the sacrificial silicon structures 110 (FIG. 2).

The surface 128 of the reformed-glass wafer 118 and the surface 112 of the silicon wafer 100 (e.g., the surfaces 128 and 112 of the modified-glass wafer 117) are ground, polished, and/or etched to remove extraneous silicon and extraneous glass to form a composite substrate 120 (FIG. 5), which is also referred to herein as a "glass substrate 120". The composite substrate 120 has opposing glass surfaces 126 and 127. In order to ensure the embedded sacrificial features 113 do not protrude above the surface 127, the ends 129 of the sacrificial silicon structures 110 are etched to be below or flush with the surface 127 of the composite substrate 120.

As defined herein, extraneous silicon is the base portion 109 of the patterned silicon wafer 115 (FIG. 2). As defined herein, extraneous glass includes the glass bumps 124 and the glass over laying ends 129 of the sacrificial silicon structures 110 of the modified-glass wafer 117 (FIG. 4). The sacrificial structures 110 on the patterned first wafer 115 (FIGS. 2 and 3) are referred to as "sacrificial structures 113 in the composite substrate 120", "embedded sacrificial structures 113", and "embedded sacrificial silicon structures 113".

The process shown in FIGS. 1-5 illustrates the steps for processing a first wafer 100 of a first material with a glass wafer 100 to form a composite substrate 120 including at least one sacrificial structure 110 of the first material and glass.

In one implementation of this embodiment, the MEMS device 321 for a MEMS structure is directly formed on the polished first surface 127 of the composite substrate 120. The processing steps illustrated in FIGS. 1-6A are the processing steps required to form a glass substrate 120 having embedded sacrificial structures 113 and a MEMS device 321 integrated on the first surface 127 of the composite substrate 120. In this embodiment, a layer of a second material is deposited on the polished first surface 127 of the composite substrate 120. Then the layer of the second material is patterned and etched to form the MEMS device 321. The second material is a material appropriate for the design and function of the MEMS device 321 as known to one skilled in the art. In another implementation of this embodiment, at least one electrically-conductive layer is deposited on the polished first surface 127 of the composite substrate 120 and/or on the layer of the second material. The electrically-conductive layer is patterned and etched to form at least one of: circuits; circuit components; conductive interconnects; bond pads; electrodes; resistors for heating; and resistors for temperature read-out, which are each referred to herein as element 130.

Figure 7:
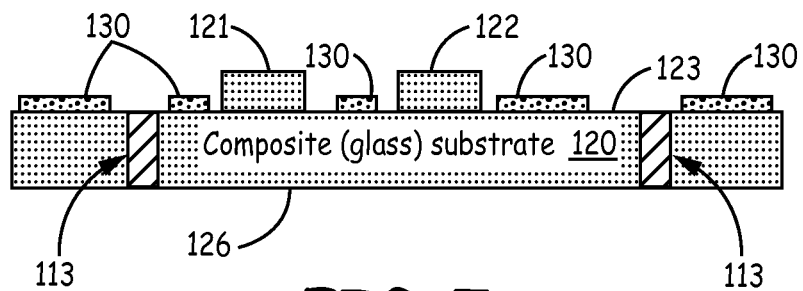
Figure 8A:
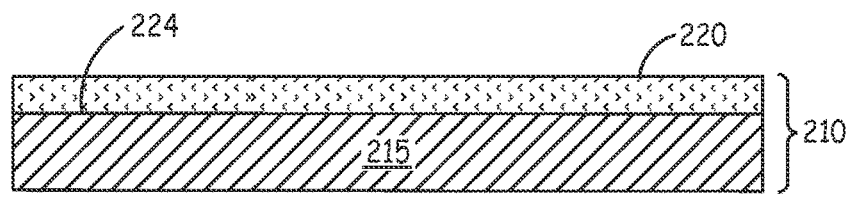
Figure 8B:
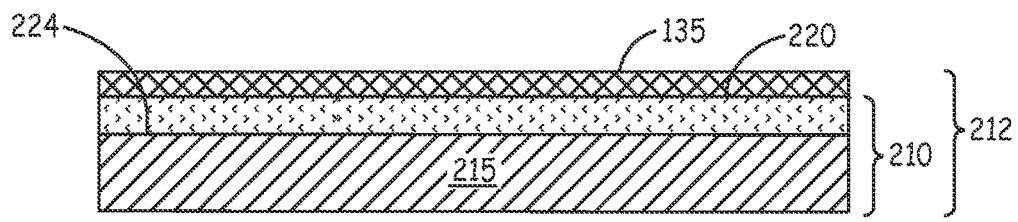
Figure 9:
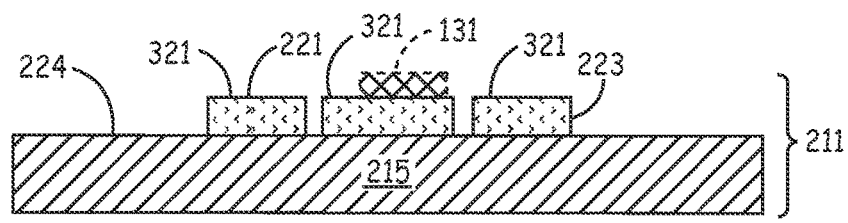
Figure 10:
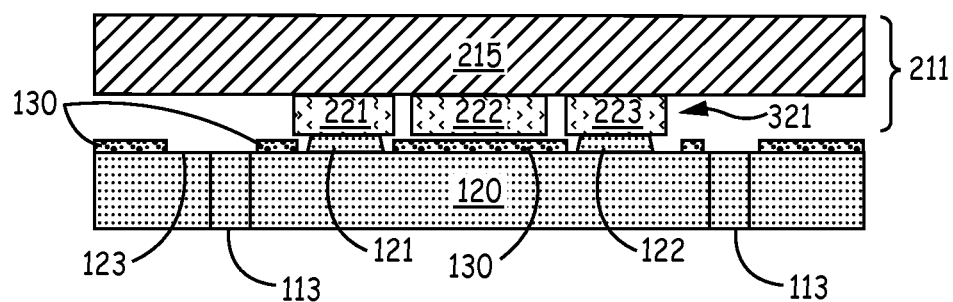
FIG. 10 shows the processed second wafer of FIG. 9 bonded to the composite substrate of FIG. 5.

In another implementation of this embodiment, the MEMS device 321 is formed on a second wafer that is bonded to the composite substrate 120. FIGS. 8A, 8B, and 9 are cross-sectional side views for various stages of production of embodiments of processing a second wafer 210 to form a MEMS device 321 on a substrate 215 according to embodiments of the present application. The processing steps illustrated in FIGS. 1-5, 6B, and 7 show the processing steps required to: form a glass substrate 120 having embedded sacrificial structures 113; form raised areas 121 and 122 for later bonding to a MEMS device 321 that is shown in FIG. 9; and form electrical components and/or electrical features 130. The processing steps illustrated in FIGS. 8A, 8B, and 9 show the processing steps required to form a MEMS device 321 on a substrate 215 of a second wafer 210. As shown in FIG. 10, the processed second wafer 211 (FIG. 9) is then bonded to the composite substrate 120 (FIG. 7).

In the embodiment shown in FIGS. 8A and 8B, the second wafer 210 includes a device layer 220 overlaying a surface 224 of the substrate 215. The second wafer 210 is processed to form a MEMS device 321 on the surface 224 of the processed second wafer 211 (FIG. 9). The substrate 215 is a handle for following processing steps when bonding the second wafer to the composite substrate 120.

The raised areas 121 and 122 (FIGS. 6B and 7) for later bonding to a MEMS device 321 are patterned and etched in the surface 127 of the glass substrate 120. In order to ensure the embedded sacrificial features 113 do not protrude above the surface 123 of the etched composite substrate 120, the ends 129 of the sacrificial silicon structures 110 are etched to be below or flush with the surface 123 (FIG. 6B) of the composite substrate 120.

In one implementation of this embodiment, electrical components and/or electrical features 130 are also formed on the glass substrate 120. In this case, at least one electrically-conductive layer is deposited on the polished first surface 127 (FIG. 5) or on the surface 123 (FIG. 6B) that is exposed after the raised areas 121 and 122 in the composite substrate 120. The at least one electrically-conductive layer is then patterned (using photoresist and/or other known techniques), and etched to form at least one of: circuits; circuit components; conductive interconnects; bond pads; electrodes; resistors for heating; and resistors for temperature read-out. These electrically-conductive features are referred to generally herein as elements 130. In one implementation of this embodiment, the electrically-conductive features 130 are formed from a metal or a metal alloy. In another implementation of this embodiment, the electrically-conductive features 130 are formed in a semiconductor material.

In one implementation of this embodiment, at least one electrically-conductive layer is deposited, patterned, and etched to form a temperature sensing element 130 on a thermal isolation stage, which is formed by later processing of the glass substrate 120. In another implementation of this embodiment, the at least one electrically-conductive layer is deposited, patterned, and etched to form a temperature controlling element 130 on the thermal isolation stage. In yet another implementation of this embodiment, the at least one electrically-conductive layer is deposited, patterned, and etched to form a temperature sensing element 130 and a temperature controlling element 130 on the thermal isolation stage. The temperature sensing element 130 and temperature controlling element 130 can be resistive elements. In one implementation of this embodiment, the temperature sensing element 130 is a Wheatstone bridge 130 formed from resistive elements patterned on the glass substrate 120.

In an exemplary embodiment in which the MEMS device 321 (FIG. 9) is formed by processing the second wafer 210 of FIG. 8A, the MEMS device 321 includes a first portion 221, a second portion 222, and a third portion 223. Other configurations for the MEMS device 321 are possible. In one embodiment, there is no temperature sensing element or temperature controlling element on the MEMS device 321 shown in FIG. 9.

In one implementation of this embodiment, the substrate 215 of the second wafer 210 is a low-doped P-type silicon substrate 220 and the device layer 220 is a highly-doped P++ silicon layer 220. The second wafer 210 is patterned and processed with DRIE to define the exemplary silicon MEMS device 321 from the highly-doped P++ silicon layer 220 (FIG. 9). In another implementation of this embodiment, the second wafer 210 is formed in a semiconductor material. In yet another implementation of this embodiment, the MEMS device 321 is formed in a material other than semiconductor.

In another exemplary embodiment in which the MEMS device 321 (FIG. 9) is formed by processing the second wafer 210 (FIG. 8A), an electrically-conductive layer 135 is deposited on the second wafer 210 (FIG. 8B). The second wafer 212, which is coated with the electrically-conductive layer 135, is further processed to pattern and etch the MEMS device 321 with an optional temperature sensing element 131 and/or temperature controlling element 131 (optionally shown in FIG. 9) as described below. In this latter embodiment, there is at least one circuit formed on the MEMS device 132. The temperature sensing element 131 is also referred to herein as a temperature read-out element 131. The temperature sensing element 131 is a resistive element and can take many different forms. In yet another implementation of this embodiment, the resonant frequency of the MEMS device 321 is designed to provide temperature feedback.

In one implementation of this embodiment, the electrically-conductive layer 135 is a metal layer. In another implementation of this embodiment, the electrically-conductive layer 135 is a semiconductor layer. Trace lines to communicatively couple the temperature controlling element 131 and/or temperature sensing element 131 to circuits, which are external to the MEMS structure, are also formed when depositing, patterning, and etching the electrically-conductive layer 135 on the MEMS substrate 210 prior to etching the semiconductor device layer 220.

In one implementation of this embodiment, one or both of the temperature controlling 131 and temperature sensing element 131 is a Wheatstone bridge 131. In another implementation of this embodiment, the MEMS device 321 is MEMS sensor 321. For example, the MEMS device 321 can be a MEMS inertial sensor 321 and include one or more of an accelerometer 321 or a gyroscope 321.

At least one temperature sensing element 130 or 131 is respectively formed on at least one of the composite substrate 120 as shown in FIG. 7 or on the MEMS device 321 on the second wafer 210 as shown in FIG. 9. In one implementation of this embodiment, at least one temperature controlling element 130 or 131 is also formed on at least one of the composite substrate 120 as shown in FIG. 7 or on the MEMS device 321 on the second wafer 210 as shown in FIG. 9. In another implementation of this embodiment, a temperature controlling element 130 is formed on the composite substrate 120 as shown in FIG. 7 and a temperature sensing element 131 is formed on the MEMS device 321 on the second wafer 210 as shown in FIG. 9. In yet another implementation of this embodiment, a temperature sensing element 130 is formed on the composite substrate 120 as shown in FIG. 7 and a temperature controlling element 131 is formed on the MEMS device 321 on the second wafer 210 as shown in FIG. 9. In yet another implementation of this embodiment, both a temperature sensing element 130 and a temperature controlling element 130 are formed on the composite substrate 120 as shown in FIG. 7. In yet another implementation of this embodiment, both a temperature sensing element 131 and a temperature controlling element 131 are formed on the MEMS device 321 on the second wafer 210 as shown in FIG. 9.

Figure 5:
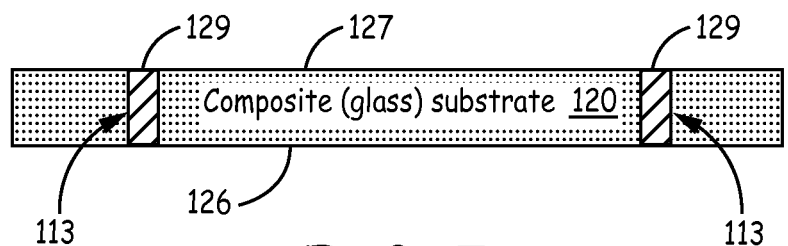
Figure 6A:
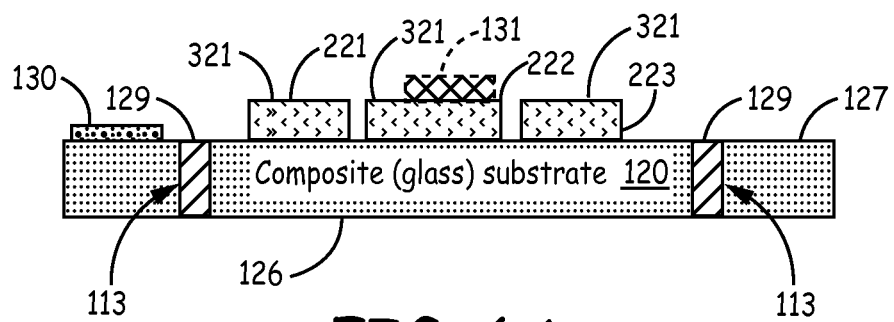
Figure 6B:
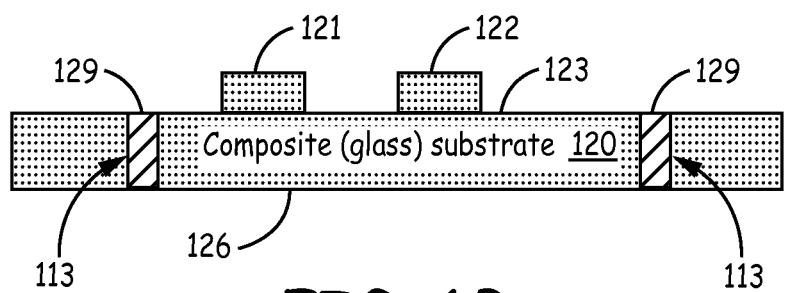

FIG. 10 shows the processed second wafer 211 of FIG. 9 bonded to the composite substrate 120 of FIG. 5. In this exemplary embodiment, the raised areas 121 and 122 of composite substrate 120 are bonded (e.g., anodically bonded) to the first portion 221 and the second portion 223, respectively, of the MEMS device 321. As shown in FIG. 10, the temperature sensing element 130 is formed on the composite substrate 120.

Figure 11:
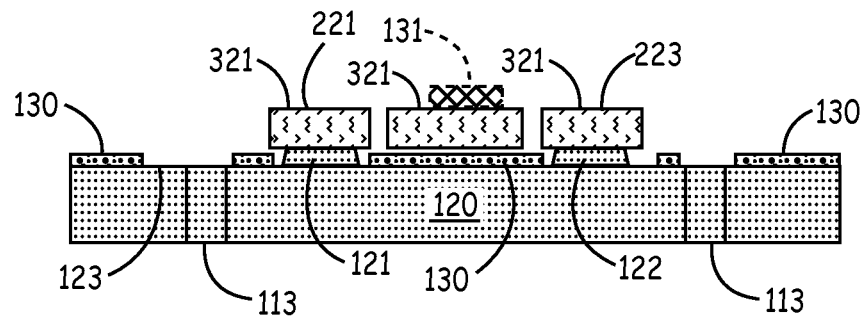
FIGS. 11-12 are cross-sectional side views of a MEMS structure on an integrated thermally isolated stage at various stages of production according to one embodiment of the present application.
Figure 12:
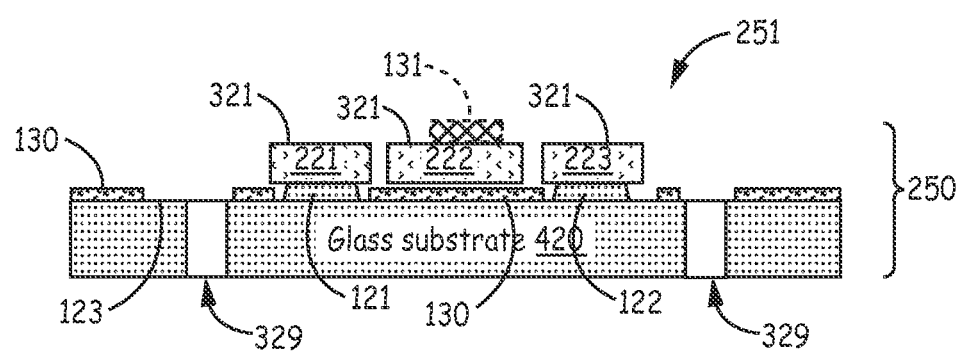

FIGS. 11-12 are cross-sectional side views of a MEMS structure on an integrated thermally isolated stage at various stages of production according to one embodiment of the present application. As shown in FIG. 11, the structure of FIG. 10 has been processed to remove (etch away) the low-doped P-type silicon 215, which is referred to herein as a "silicon handle". Chemical etchants are used to keep the highly-doped P++ silicon in the first, second, and third portions 221, 222, and 223 of the MEMS device 321 while etching the low-doped P-type silicon 215.

FIG. 12 shows the structure of FIG. 11 after the sacrificial silicon structures 113 embedded in the glass substrate 120 have been etched away so that the remaining glass substrate 420 includes voids 329. The areas where the sacrificial silicon structures 113 had been are now voids 329. The voids 329 are also referred to herein as "cuts 329" in the glass substrate 420. The remaining glass substrate 420 is attached to the MEMS device 321. The glass substrate 420 with the attached MEMS device 321 is referred to as MEMS structure 250. The glass substrate 420 also includes at least one site (e.g., bond pad 130) configured for electrically coupling the MEMS structure 250 to a package/chip carrier.

Figure 13:
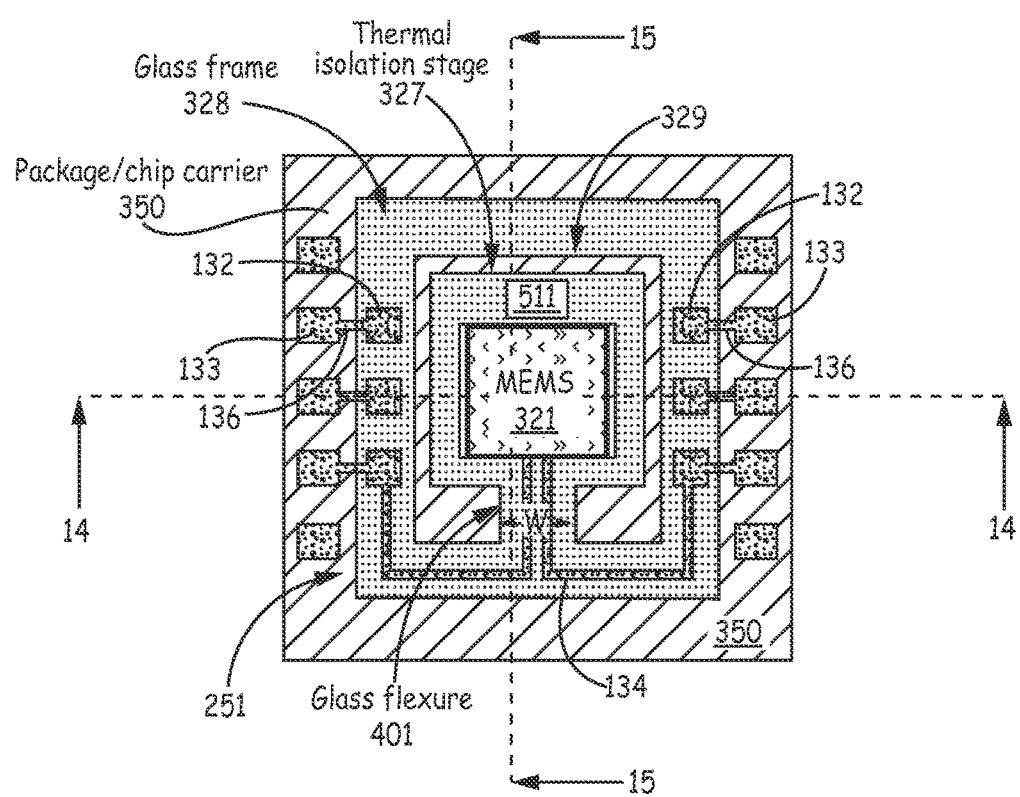
FIG. 13 shows a top view of an embodiment of a MEMS structure on a package according to one embodiment of the present application.
Figure 14:
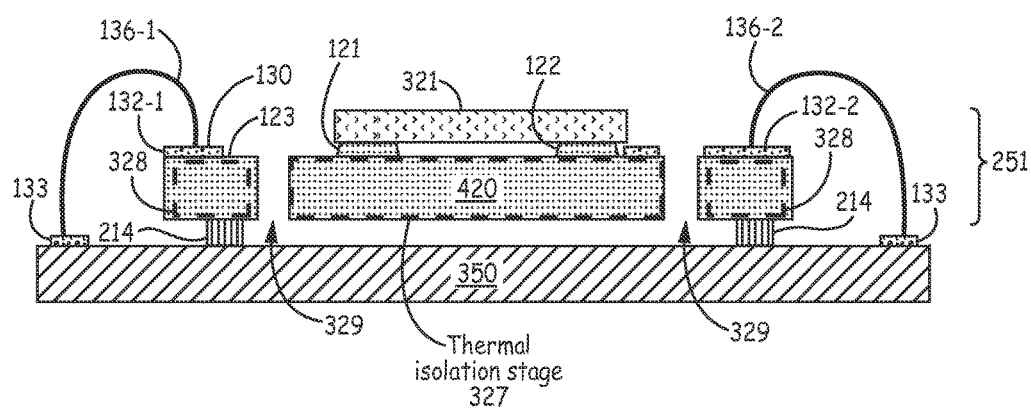
FIG. 14 is a first cross-sectional side view of the embodiment of the MEMS structure of FIG. 13.
Figure 15:
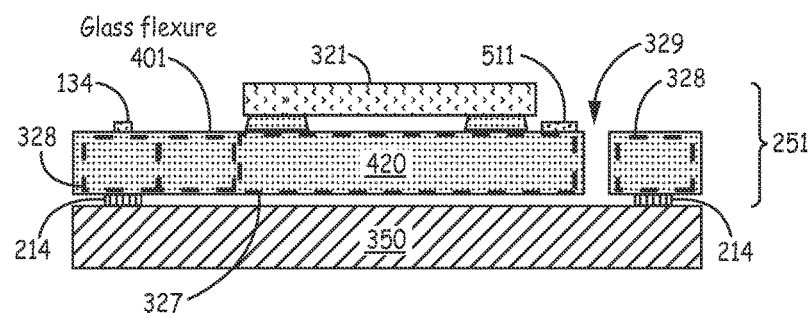
FIG. 15 is a second cross-sectional side view of the embodiment of the MEMS structure of FIG. 13.

FIG. 13 shows a top view of an embodiment of a MEMS structure 251 on a package 350 according to one embodiment of the present application. The MEMS structure 251 is a chip (die) that is formed after a glass substrate 420 is diced to form a plurality of MEMS structures 251. The package 350 is also referred to herein as a chip carrier 350. FIG. 14 is a first cross-sectional side view of the embodiment of the MEMS structure 251 on the chip carrier 350 of FIG. 13. The plane upon which the cross-section view of FIG. 14 is taken is indicated by section line 14-14 in FIG. 13. FIG. 15 is a second cross-sectional side view of the embodiment of the MEMS structure 251 on the chip carrier 350 of FIG. 13. The plane upon which the cross-section view of FIG. 15 is taken is indicated by section line 15-15 in FIG. 13.

As shown from the top view of FIG. 13, the voids (cuts) 329, which were formed in glass substrate 420 by etching away the sacrificial structure 110 of the first material from a composite substrate 120 (FIG. 11), form a thermal isolation stage 327, at least one glass flexure 401, and a glass frame 328. The MEMS device 321 is built directly onto the glass thermal isolation stage 327, which also supports a temperature sensing element 511. The thermal isolation stage 327 is connected to the glass frame 328 by the thermally isolating glass flexure 401, which provides the large thermal resistance necessary to minimize power consumption during active temperature control of the MEMS device 321. The narrow width W of the glass flexure 401 reduces heat flow between the MEMS device 321 on the thermal isolation stage 327 and the glass frame 328.

The portion of the thermal isolation stage 327 of the glass substrate 420 is shown in the cross-sectional view of FIGS. 14 and 15 by the dashed box 327. The portion of the glass frame 328 of the glass substrate 420 is shown in FIGS. 14 and 15 by the dashed box 328. The glass frame 328 is attached to the chip carrier 350 by bonds 214 (FIGS. 14 and 15).

As shown in FIG. 13, trace lines 134 communicatively couple the MEMS device 321 to bond pads 132. The glass frame 328 of the glass substrate 420 includes at least one site (bond pads 132) for coupling the MEMS structure 251 to bonds 133 on a package 350. Pluralities of wires 136 electrically couple the bond pads 132 to the bond pads 133 on the package 350. Electrical signals are routed between the MEMS device 321 and bond pads 133 on the package 350 via trace lines 134 and bond pads 132 on the anchored glass frame 328.

The trace lines 134 overlay the glass flexure 401. In FIG. 15, a cross section view of the trace lines 134 is shown overlaying the glass frame 328 of the glass substrate 420. Heat transfer via the trace lines 134 between the MEMS device 321 and the glass frame 328 is negligible since the trace lines 134 have a width that is much less than the width W (FIG. 13) of the glass flexure 401.

One skilled in the art recognizes that the MEMS structure 251 can be packaged as required for the structure and function of the MEMS device 321 in the MEMS structure 250. Due to the low thermal conductivity of the glass substrate 420, the MEMS device 321 is thermally isolated from the package/chip carrier 350. This enables low-power active temperature control of the MEMS device 321.

Thus, the device layer 220 (FIG. 8A), which was bonded to the glass substrate 420, forms the MEMS device 321 and at least one temperature sensing element 511 on the thermal isolation stage 327. In one implementation of this embodiment, the device layer 220 (FIG. 8A), which was bonded to the glass substrate 420, forms the MEMS device 321 as well as the temperature sensing element 511 so the temperature sensing element 511 is on the MEMS device 321. In one implementation of this embodiment, the temperature sensing element 511 is a Wheatstone bridge 511. In another implementation of this embodiment, a temperature controlling element 511 is a Wheatstone bridge 511 on the MEMS device 321.

Figure 16:
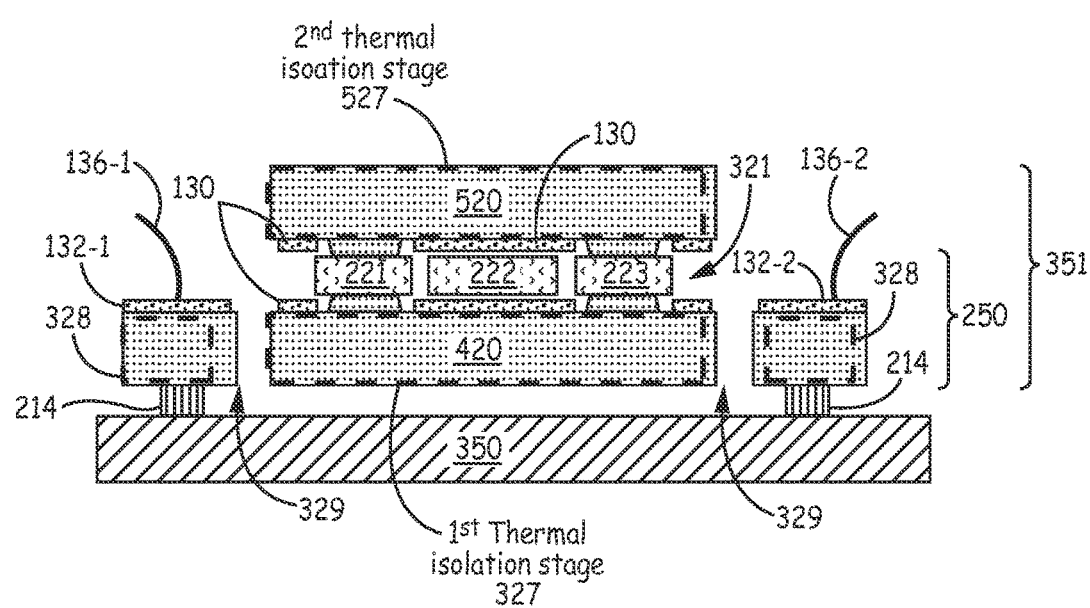
FIG. 16 shows a cross-sectional side view of another embodiment of a MEMS structure according to one embodiment of the present application.
Figure 17:
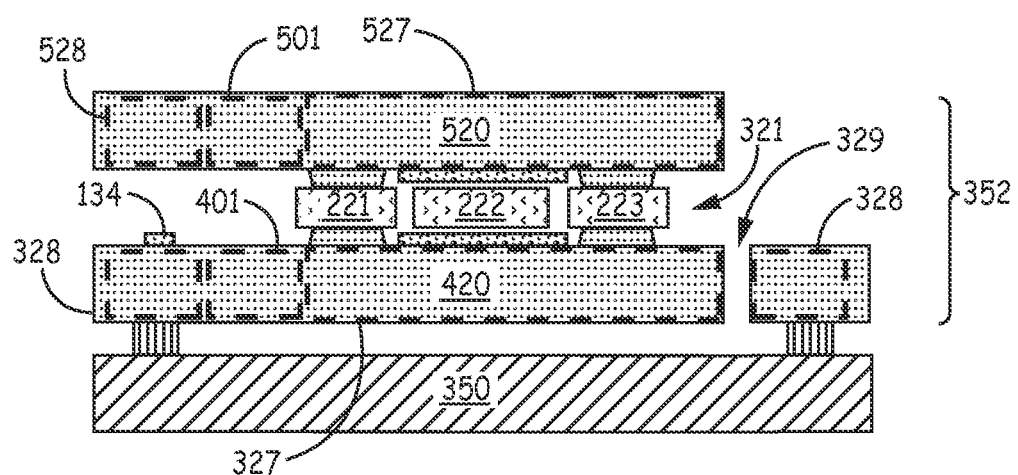
FIG. 17 shows a cross-sectional side view of another embodiment of a MEMS structure according to one embodiment of the present application.
Figure 18:
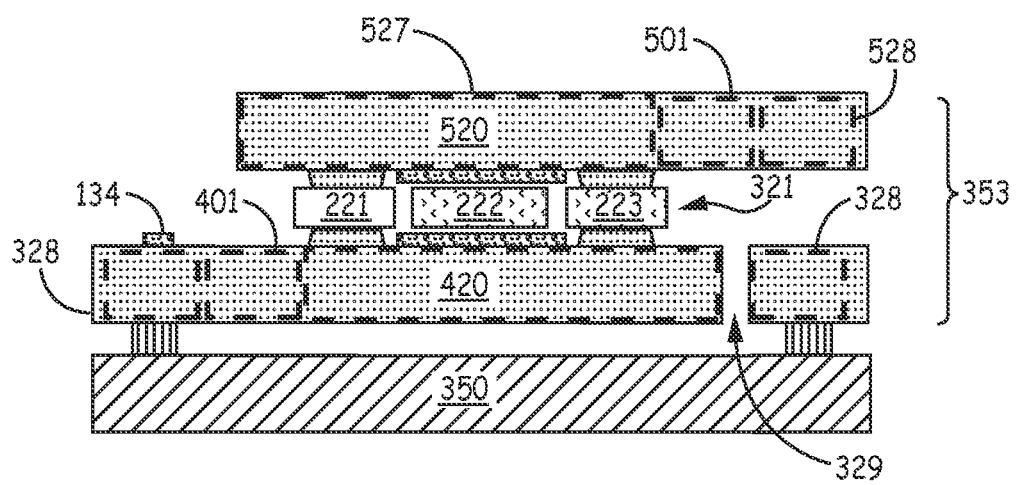
FIG. 18 shows a cross-sectional side view of another embodiment of a MEMS structure according to the present application.

In some embodiments, the MEMS device 321 is enclosed by two glass substrates. Embodiments of such MEMS structures are shown in FIGS. 16-18. FIGS. 16-18 show various embodiments of exemplary glass flexures 401 and 501. FIG. 16 shows an embodiment of a first thermal isolation stage 327 and a second thermal isolation stage 527 thermally isolating a MEMS device 321 in a MEMS structure 351. FIG. 17 shows an embodiment of a first thermal isolation stage 327 attached to a first glass flexure 401 and a second thermal isolation stage 527 attached to a second glass flexure 501 that thermally isolating a MEMS device 321 in a MEMS structure 352. FIG. 17 shows another embodiment of a first thermal isolation stage 327 attached to a first glass flexure 401 and a second thermal isolation stage 527 attached to a second glass flexure 501 that thermally isolating a MEMS device 321 in a MEMS structure 353.

The embodiments shown in FIGS. 16-18 require processing of a third wafer of a third material with a second solid-glass wafer 100 to form a second composite substrate 520 including at least one sacrificial structure 110 of the third material and glass. The second composite substrate 520 is bonded to the second wafer 210 that includes the MEMS device 321 and the glass substrate 420 is a first glass substrate 420. In this manner the MEMS structure 351, 352, or 353 of respective FIG. 16, 17, or 18 include a second glass substrate 520 disposed on the device layer 220 (FIGS. 8A and 8B) that forms the MEMS device 321. The MEMS device 321 is thermally isolated by two thermal isolation stages 327 and 527 (FIGS. 16-18), that each have respective thermally isolating glass flexure 401 and 501. In these embodiments, the MEMS device 321 is enclosed by the first glass substrate 420 and the second glass substrate 520.

The processing of a third wafer of a third material with a second solid-glass wafer 100 includes the same steps described above with reference to FIGS. 1-5 for processing of the first wafer of the first material with the solid-glass wafer 100 to form the first composite substrate 120.

The second glass substrate 520 also contains embedded sacrificial structures 113, raised areas 121 and 122 of glass for bonding with the regions 221 and 223 of the MEMS device 321, and patterned electrically conductive material to form elements 130 to serve as interconnects, bond pads, electrodes, resistors for heating, and resistors for temperature read-out, and the like. The second glass substrate 520 is bonded (e.g., anodically bonded) to the wafer 250 (FIG. 12) to form a bonded wafer stack, a portion of which is shown as MEMS structure 351, 352, and 353 in respective FIGS. 16, 17, and 18. In this manner, the MEMS device 321 is encapsulated in glass.

In one implementation of this embodiment, the second glass substrate 520 is bonded to the wafer 250 (FIG. 12) to form a bonded wafer stack prior to etching out the sacrificial silicon structures 113. In this case, chemical etchants are used to remove the sacrificial silicon structures 113 embedded in the glass wafers 120 and 520 of the bonded wafer stack 325 (FIG. 13). The areas where the sacrificial silicon structures 113 had been are now cuts 329 in the second composite substrate 520. In another implementation of this embodiment, the second glass substrate 520 is bonded to the wafer 250 (FIG. 12) to form a bonded wafer stack after etching out the sacrificial silicon structures 113.

One skilled in the art upon reading and understanding this document will understand the second glass substrate 520 is formed by processing a third wafer of the third material with a second glass wafer to form a second composite substrate including at least one sacrificial structure of the third material and glass. As shown in FIGS. 1-5, a layer of the third material is etched to form the at least one sacrificial structure 110. The at least one sacrificial structure 110 defines a mold for at least one thermally isolating glass flexure and a second thermal isolation stage (e.g., 527 shown in FIG. 17) for the MEMS device 321.

The at least one sacrificial structure of the third material is bonded to the second glass wafer 125 in an atmosphere (e.g., pressure $P_2$) that is less than an external ambient atmosphere 75 (e.g., pressure $P_1$). The second glass wafer is heated beyond the glass softening temperature to form a second modified-glass wafer 117 (FIG. 4) in which the at least one sacrificial structure 110 of the third material is embedded in glass. A first surface 128 and a second surface 112 of the second modified-glass wafer 117 is polished.

After dicing the wafer stack, the finished die is bonded into a package/chip carrier 350. Wire bonds 136-1 and 136-2 are attached to the bond pads 132-1 and 132-2, respectively, (FIG. 16) to complete electrical connections to external circuits as required. Due to the low thermal conductivity of the first glass substrate 420 and the second glass substrate 520, the resulting MEMS device 321 is thermally isolated from the package 350 (FIG. 13) and the external environment to enable low-power active temperature control of the MEMS device 321.

In one implementation of this embodiment, the third material of the third wafer is the same as the first material of the first wafer. In another implementation of this embodiment, the third material and the first material are silicon.

In other embodiments, the thermal isolation feature takes other shapes appropriate to isolating the MEMS device from relatively high temperatures induced by the package that houses the device.

In one implementation of this embodiment, the thermally isolated stages 327 and 527 surround or encase a fixed anchor (e.g., an anchor in the middle of the die) and part of the die is anchored and, thus, is not thermally isolated from the package. For example, a portion of the die in the center is not thermally isolated while the region around the perimeter (e.g., surrounding thermally isolated portion of the die in the center) is thermally isolated.

Example Embodiment

Example 1 includes a method for fabricating a thermally isolated microelectromechanical system (MEMS) structure, the method comprising: processing a first wafer of a first material with a glass wafer to form a composite substrate including at least one sacrificial structure of the first material and glass; forming a MEMS device in a second material; forming at least one temperature sensing element on at least one of: the composite substrate; and the MEMS device; and etching away the at least one sacrificial structure of the first material in the composite substrate to form at least one thermally isolating glass flexure, wherein the MEMS device is thermally isolated on a thermal isolation stage by the at least one thermally isolating glass flexure, and wherein the at least one temperature sensing element in on a respective at least one of: the thermal isolation stage; and the MEMS device.

Example 2 includes the method of Example 1, wherein processing the first wafer of the first material with the glass wafer to form the composite substrate comprises: etching a layer of the first material to form the at least one sacrificial structure, the at least one sacrificial structure defining a mold for the at least one thermally isolating glass flexure and the thermal isolation stage; bonding the at least one sacrificial structure of the first material to the glass wafer in an atmosphere that is less than an external ambient atmosphere; heating the glass wafer beyond the glass softening temperature to form a modified-glass wafer in which the at least one sacrificial structure of the first material is embedded in glass; polishing a first surface of the modified-glass wafer; and polishing a second surface of the modified-glass wafer.

Example 3 includes the method of Example 2, wherein the glass wafer is a first glass wafer, and the composite substrate is a first composite substrate, the method further comprising: processing a third wafer of a third material with a second glass wafer to form a second composite substrate including at least one sacrificial structure of the third material and glass; and bonding the second composite substrate to one of: a second wafer that includes the MEMS device; and the first composite substrate.

Example 4 includes the method of Example 3, wherein the thermal isolation stage is a first thermal isolation stage, wherein the modified-glass wafer is a first modified-glass wafer, and wherein processing the third wafer of the third material with the second glass wafer to form the second composite substrate including at least one sacrificial structure of the third material and glass comprises: etching a layer of the third material to form the at least one sacrificial structure, the at least one sacrificial structure defining a mold for at least one thermally isolating glass flexure and a second thermal isolation stage for the MEMS device; bonding the at least one sacrificial structure of the third material to the second glass wafer in an atmosphere that is less than an external ambient atmosphere; heating the second glass wafer beyond the glass softening temperature to form a second modified-glass wafer in which the at least one sacrificial structure of the third material is embedded in glass; polishing a first surface of the second modified-glass wafer; and polishing a second surface of the second modified-glass wafer.

Example 5 includes the method of any of Examples 1-4, wherein forming the MEMS device in the second material comprises: depositing a layer of the second material on the composite substrate; and patterning and etching the layer of the second material.

Example 6 includes the method of any of Examples 1-5, wherein forming the MEMS device in the second material comprises: processing a second wafer in the second material to form the MEMS device on the second wafer; and bonding the second wafer to the composite substrate.

Example 7 includes the method of any of Examples 1-6, further comprising: depositing at least one electrically-conductive layer on the polished first surface of the composite substrate; and patterning and etching the at least one electrically-conductive layer to form at least one of: circuits; circuit components; conductive interconnects; bond pads; electrodes; resistors for heating; and resistors for temperature read-out.

Example 8 includes the method of any of Examples 1-7, further comprising: forming at least one temperature controlling element on at least one of: the composite substrate; and the MEMS device, wherein upon etching away the at least one sacrificial structure of the first material in the composite substrate, the at least one temperature controlling element is on a respective at least one of: the thermal isolation stage; and the MEMS device.

Example 9 includes the method of any of Examples 1-8, wherein forming the at least one temperature sensing element on at least one of: the composite substrate; and the MEMS device comprises: patterning at least one resistive element on a polished first surface of the composite substrate, wherein, upon etching away the at least one sacrificial structure of the first material in the composite substrate, the at least one temperature sensing element is on the thermal isolation stage.

Example 10 includes a method for fabricating a thermally isolated microelectromechanical system (MEMS) structure, the method comprising: forming a composite substrate containing at least one embedded sacrificial structure by: etching a layer of a first material to form the at least one sacrificial structure, the at least one sacrificial structure defining a mold for at least one thermally isolating glass flexure and a thermal isolation stage for a MEMS device; bonding the layer of the first material to a glass wafer in an atmosphere that is less than an external ambient atmosphere; heating the glass wafer beyond the glass softening temperature to form a modified-glass wafer in which the at least one sacrificial structure is embedded in glass; polishing a first surface of the modified-glass wafer; and polishing a second surface of the modified-glass wafer; forming a MEMS device in a second material; forming at least one temperature sensing element on at least one of: the composite substrate; and the MEMS device; and etching away the at least one sacrificial structure of the first material in the composite substrate to form the at least one thermally isolating glass flexure and the thermal isolation stage, wherein the MEMS device is thermally isolated on the thermal isolation stage.

Example 11 includes the method of Example 10, wherein forming the MEMS device in the second material comprises: depositing a layer of the second material on the composite substrate; and patterning and etching the layer of the second material.

Example 12 includes the method of any of Examples 10-11, wherein forming the MEMS device in the second material comprises: processing a second wafer in the second material to form the MEMS device, the method further comprising: forming raised areas on the polished first surface of the composite substrate; and bonding the second wafer to the raised areas of composite substrate.

Example 13 includes the method of Example 12, wherein the composite substrate is a first composite substrate, the method further comprising: processing a third wafer of a third material to form a second composite substrate including at least one sacrificial structure of the third material and glass; and bonding the processed third wafer to the second wafer including the MEMS device.

Example 14 includes the method of Example 13, wherein the mold is a first mold, the glass wafer is a first glass wafer, the modified-glass wafer is a first modified-glass wafer, and the thermal isolation stage is a first thermal isolation stage, and wherein processing the third wafer of the third material to form the second composite substrate further comprises: etching a layer of the third material to form the at least one sacrificial structure, the at least one sacrificial structure defining a second mold for at least one thermally isolating glass flexure and a second thermal isolation stage for the MEMS device; bonding the at least one sacrificial structure of the third material to a second glass wafer in an atmosphere that is less than the external ambient atmosphere; heating the second glass wafer beyond the glass softening temperature to form a second modified-glass wafer in which the at least one sacrificial structure of the third material is embedded in glass; polishing a first surface of the second modified-glass wafer; and polishing a second surface of the second modified-glass wafer.

Example 15 includes the method of any of Examples 10-14, wherein forming the at least one temperature sensing element on at least one of: the composite substrate; and the MEMS device comprises at least one of: patterning and etching at least one resistive element on the polished first surface of the composite substrate, wherein, upon etching away the at least one sacrificial structure of the first material in the composite substrate, the at least one temperature sensing element is on the thermal isolation stage; and patterning and etching at least one temperature sensing element on the MEMS device.

Example 16 includes the method of any of Examples 10-15, further comprising: forming at least one temperature controlling element on at least one of: the composite substrate; and the MEMS device.

Example 17 includes the method of any of Examples 10-16, further comprising: depositing at least one electrically-conductive layer on the polished first surface of the composite substrate; and patterning and etching the at least one electrically-conductive layer to form at least one of: circuits; circuit components; conductive interconnects; bond pads; electrodes; resistors for heating; and resistors for temperature read-out.

Example 18 includes a microelectromechanical (MEMS) structure, comprising: a composite substrate including voids from etching away at least one sacrificial structure of a first material from a composite substrate including the at least one sacrificial structure of the first material and glass, the composite substrate further including at least one site configured for coupling the MEMS structure to a package; a device layer, attached to the composite substrate, the device layer including a MEMS device, wherein a thermal isolation stage, which is thermally isolated by at least one thermally isolating glass flexure, supports the MEMS device; and at least one temperature sensing element on at least one of: the thermal isolation stage; and the MEMS device.

Example 19 includes the MEMS structure of Example 18, further including: a plurality of bonds coupling the composite substrate to the package, wherein the at least one site configured for coupling the MEMS structure to the package includes: a plurality of bump bonds coupled to a glass frame in the composite substrate.

Example 20 includes the MEMS structure of any of Examples 18-19, wherein the composite substrate is a first composite substrate, the MEMS structure further including a second composite substrate disposed on the device layer, wherein the MEMS device on the thermal isolation stage is enclosed by the first composite substrate and the second composite substrate.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A microelectromechanical (MEMS) structure, comprising:
   a composite substrate including voids from etching away at least one sacrificial structure of a first material from a composite substrate including the at least one sacrificial structure of the first material and a second material, the composite substrate further including at least one site configured for coupling the MEMS structure to a package;
   a device layer, attached to the composite substrate, the device layer including a MEMS device, wherein a thermal isolation stage, which is thermally isolated by at least one thermally isolating flexure formed of the second material, supports the MEMS device; and
   at least one temperature sensing element on at least one of: the thermal isolation stage; and the MEMS device.

2. The MEMS structure of claim 1, further including:
   a plurality of bonds coupling the composite substrate to the package, wherein the at least one site configured for coupling the MEMS structure to the package includes:
   a plurality of bump bonds coupled to a glass frame in the composite substrate.

3. The MEMS structure of claim 1, wherein the composite substrate is a first composite substrate, the MEMS structure further including a second composite substrate disposed on the device layer, wherein the MEMS device on the thermal isolation stage is enclosed by the first composite substrate and the second composite substrate.

4. The MEMS structure of claim 1, wherein the second material of the composite substrate comprises glass.

5. The MEMS structure of claim 1, wherein the thermally isolating flexure comprises a layer of glass that connects the thermal isolation stage and a glass frame.

6. The MEMS structure of claim 5, and further comprising metal lines, having a negligible thermal conductive cross section, deposited on the flexure to enable electrical connection of external circuits to the device layer.

7. The MEMS structure of claim 5, and further comprising metal lines, having a negligible thermal conductive cross section, deposited on the flexure to enable electrical connection of external circuits to the at least one temperature sensing element.

8. The MEMS structure of claim 1, wherein the device layer is formed directly on a surface of the composite substrate.

9. The MEMS structure of claim 1, wherein the device layer is formed on raised areas on the composite substrate.

10. The MEMS structure of claim 1, and further including at least one electrical feature formed on the composite substrate.

11. The MEMS structure of claim 10, wherein the at least one electrical feature comprises the at least one temperature sensing element on the thermal isolation stage.

12. The MEMS structure of claim 11, wherein the at least one temperature sensing element comprises a Wheatstone bridge.

13. The MEMS structure of claim 12, wherein the at least one electrical feature includes a temperature controlling element.

14. The MEMS structure of claim 1, wherein the MEMS device comprises at least one of a silicon MEMS inertial sensor, proof masses, interdigitated comb fingers, flexures and other electrodes.

15. The MEMS structure of claim 1, wherein the thermally isolating flexure and the thermal isolation stage are formed in the composite substrate.

16. The MEMS structure of claim 1, wherein the second material is a material with a melting point that is less than a melting point of the first material and with a thermal conductivity that is less than or on the order of magnitude of 1W/m-K.

* * * * *